(12) United States Patent
Liu et al.

(10) Patent No.: US 9,269,748 B2
(45) Date of Patent: Feb. 23, 2016

(54) DISPLAY DEVICE AND METHOD OF CONVERTING SOLAR ENERGY INTO ELECTRICAL ENERGY

(75) Inventors: Yawei Liu, Guangdong (CN); Yi-Fan Wang, Shenzhen (CN)

(73) Assignee: Shenzhen China Star Optoelectronics Technology Co., Ltd., Shenzhen, Guangdong (CN)

( * ) Notice: Subject to any disclaimer, the term of this patent is extended or adjusted under 35 U.S.C. 154(b) by 677 days.

(21) Appl. No.: 13/636,649

(22) PCT Filed: Jul. 13, 2012

(86) PCT No.: PCT/CN2012/078629
§ 371 (c)(1),
(2), (4) Date: Sep. 21, 2012

(87) PCT Pub. No.: WO2014/005350
PCT Pub. Date: Jan. 9, 2014

(65) Prior Publication Data
US 2014/0009453 A1    Jan. 9, 2014

(30) Foreign Application Priority Data
Jul. 3, 2012  (CN) .......................... 2012 1 0227491

(51) Int. Cl.
*G09G 3/30* (2006.01)
*H01L 27/28* (2006.01)
*G09G 3/32* (2006.01)

(52) U.S. Cl.
CPC ............ *H01L 27/288* (2013.01); *G09G 3/3225* (2013.01); *G09G 2330/02* (2013.01)

(58) Field of Classification Search
CPC  H01L 27/288; H01L 27/3216; G09G 3/3225; G09G 2330/02; G09G 3/2092
See application file for complete search history.

(56) References Cited

U.S. PATENT DOCUMENTS

| | | | |
|---|---|---|---|
| 7,400,345 B2 * | 7/2008 | Cok ............................. | 348/173 |
| 7,573,286 B2 * | 8/2009 | Huelson et al. .......... | 324/760.01 |
| 7,863,629 B2 * | 1/2011 | Son ................................ | 257/88 |
| 8,477,125 B2 * | 7/2013 | Park et al. ..................... | 345/207 |
| 8,791,884 B2 * | 7/2014 | Kim ................................ | 345/77 |
| 2004/0113903 A1 | 6/2004 | Mikami et al. | |
| 2005/0260777 A1 | 11/2005 | Brabec et al. | |
| 2009/0219273 A1 | 9/2009 | Nathan et al. | |
| 2011/0108856 A1 | 5/2011 | Wu et al. | |

FOREIGN PATENT DOCUMENTS

| | | |
|---|---|---|
| CN | 1506925 A | 6/2004 |
| CN | 101739909 A | 6/2010 |
| CN | 101925945 A | 12/2010 |

* cited by examiner

*Primary Examiner* — Abbas Abdulselam
(74) *Attorney, Agent, or Firm* — Muncy, Geissler, Olds & Lowe, P.C.

(57) ABSTRACT

The present invention discloses a display device. The display device includes an OLED display and a voltage converter. The OLED display used for displaying images comprises at least one pixel comprising red, green and blue sub-pixels and arranges an OPV cell used for converting solar energy into electrical energy. The voltage converter is used for converting voltage of the electrical energy. The present invention also discloses a method that the display device converts solar energy into electrical energy.

11 Claims, 4 Drawing Sheets

DISPLAY DEVICE AND METHOD OF CONVERTING SOLAR ENERGY INTO ELECTRICAL ENERGY

FIELD OF THE INVENTION

The present invention relates to a display technology field, more particularly, to a display device and a method of converting solar energy into electrical energy.

DESCRIPTION OF THE PRIOR ART

Organic light emitting diode (OLED) is a display technology for next generation. It has broad application future because of some advantages like active emitting, low weight, energy saving, etc. There are two characteristics of a conventional OLED display device: one is larger panel size, and the other is consuming electrical energy rather than generating electrical energy.

There are a few ways of using solar energy in traditional technology, such as photo-thermal, opto-electrical, photo-chemistry, etc, wherein the solar electrical energy generation is the most direct way. Solar battery is an apparatus capable of converting solar energy into electrical energy. Sunlight shines on a P-N junction to form hole-electron pairs. Under an electrical field between the P-N junction, photo-induced-holes flow from P region to anode, and photo-induced-electrons flow from P region to N region, inducing a current when a loop is formed.

Traditional solar battery is inorganic silicon solar battery or inorganic compound battery. However, there is a tendency for solar battery application that organic compound substitutes for inorganic material. It is important for providing cheaper electrical energy by a use of solar energy because there are advantages of organic material, such as flexibility, easy-made, diverse sources of material, low cost, etc.

If the conventional OLED panel with larger flat size Converting solar energy in nature better by taking the advantage of larger flat size in the OLED.

SUMMARY OF THE INVENTION

The object of the present invention is to provide a display device to generate electrical energy by converting solar energy and to supply the generated electrical energy to the device.

According to the present invention, a display device comprises an organic light emitting diode (OLED) display for displaying images, the OLED display comprising at least one pixel, each pixel comprising a plurality of sub-pixels, the OLED display arranging an organic photovoltaic (OPV) cell for absorbing solar energy and then converting the solar energy into electrical energy; a voltage converter electrically connected with the OPV cell, for converting voltage of the electrical energy generated from the OPV cell; a rechargeable battery electrically connected with the OLED display and the voltage converter, for saving electrical energy generated from the OPV cell and supplying electrical energy to the OLED display; and a control unit electrically connected with the OLED display and the voltage converter for controlling a switch of the OLED display and controlling the OPV cell to output electrical energy to the voltage converter.

In one aspect of the present invention, the OPV cell comprises at least one secondary battery disposed on the OLED display, and the secondary battery is used for absorbing solar energy and converting the solar energy into electrical energy.

In another aspect of the present invention, the OLED display comprises an OLED layer, and the secondary battery is disposed on the surface where the OLED layer locates.

In another aspect of the present invention, the OLED display further comprises an anode layer and a cathode layer, and the secondary battery electrically connects with the anode layer and the cathode layer.

In another aspect of the present invention, the secondary battery is also used for outputting the electrical energy to the voltage converter via the anode layer and the cathode layer.

According to the present invention, a display device comprises an organic light emitting diode (OLED) display for displaying images, the OLED display comprising at least one pixel, each pixel comprising a plurality of sub-pixels, the OLED display arranging an organic photovoltaic (OPV) cell for absorbing solar energy and then converting the solar energy into electrical energy; and a voltage converter electrically connected with the OPV cell, for converting voltage of the electrical energy generated from the OPV cell.

In one aspect of the present invention, the OPV cell comprises at least one secondary battery disposed on the OLED display, and the secondary battery is used for absorbing solar energy and converting the solar energy into electrical energy.

In another aspect of the present invention, the OLED display comprises an OLED layer, and the secondary battery is disposed on the surface where the OLED layer locates.

In another aspect of the present invention, the OLED display further comprises an anode layer and a cathode layer, the secondary battery electrically connects with the anode layer and the cathode layer, and the secondary battery is used for outputting the electrical energy to the voltage converter via the anode layer and the cathode layer.

In another aspect of the present invention, the display device further comprises a rechargeable battery electrically connected with the OLED display and the voltage converter, for saving electrical energy generated from the OPV cell and supplying electrical energy to the OLED display.

In another aspect of the present invention, the display device further comprises a control unit electrically connected with the OLED display and the voltage converter, for controlling a switch of the OLED display and controlling the OPV cell to output electrical energy to the voltage converter.

According to the present invention, a method of using a display device to convert solar energy into electrical energy is provided. The display device comprises an OLED display and a voltage converter. The OLED display arranges an OPV cell. The method comprises following steps: (A) the OPV cell absorbing solar energy and then converting the solar energy into electrical energy; and (B) the voltage converter converting voltage of the electrical energy generated from the OPV cell.

In another aspect of the present invention, the OPV cell comprises at least one secondary battery, the at least one secondary battery is disposed in the OLED display. The step (A) further comprises a following step: (a1) the secondary battery absorbing the solar energy and then converting the solar energy into electrical energy.

In another aspect of the present invention, the display device further comprises a rechargeable battery, the rechargeable battery electrically connects with the OLED display and the voltage converter. The method further comprises a following step: (C) the rechargeable battery saves the electrical energy generated from the OPV cell and supplies electrical energy to the OLED display.

In another aspect of the present invention, the display device further comprises a control unit electrically connected with the OPV cell and the OLED display. The method further comprises a following step: (D) the control unit controls a switch of the OLED display and the OPV cell to output electrical energy to the voltage converter.

Compared to the prior art, the display device of the present invention is capable of converting solar energy into electrical energy because there is an organic solar battery, more specifically, a plurality of secondary batteries, in the OLED display. The plurality of secondary batteries are disposed with the pixels of the OLED display together. Therefore, the display device is capable of absorbing solar energy and then converting the solar energy into electrical energy. In addition, the present invention further comprises a voltage conversion device and rechargeable batteries. Therefore, the present invention is capable of converting voltage of the electrical energy generated by the organic solar battery to charge the rechargeable batteries or supply electrical energy to the OLED display. In hence, it makes into practice that the OLED device generates electrical energy by solar energy.

DETAILED DESCRIPTION OF THE PREFERRED EMBODIMENTS

These and other features, aspects and advantages of the present disclosure will become understood with reference to the following description, appended claims and accompanying figures.

Figure 1:
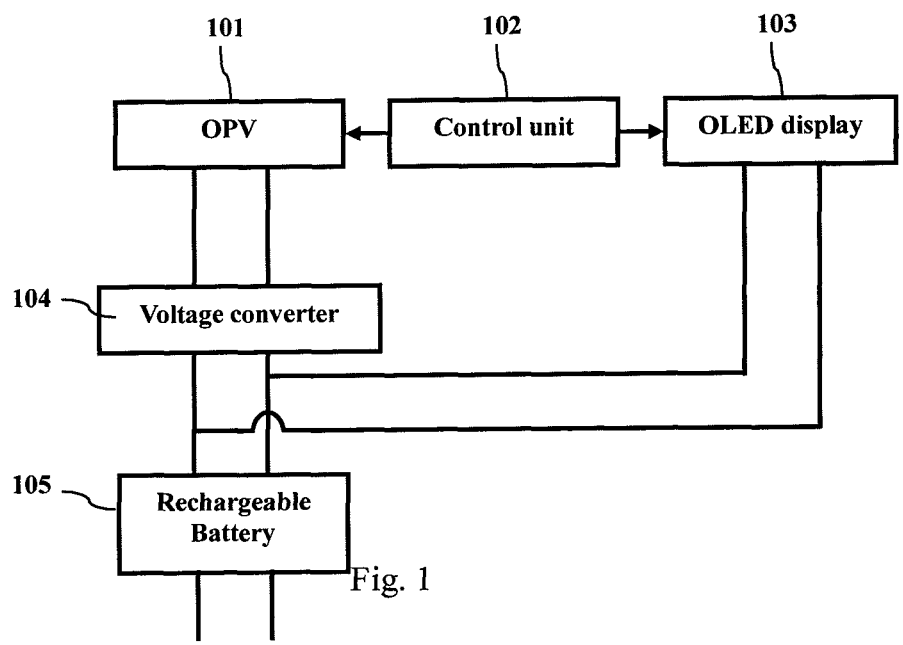
FIG. 1 is a block diagram of a display device according to the present invention.

Referring to FIG. 1, FIG. 1 is a block diagram of a display device according to the present invention. The display device comprises an OLED display 103, a control unit 102, an organic photovoltaic (OPV cell) 101, a voltage converter 104 and a rechargeable battery 105. The control unit 102 electrically connects with the OPV cell 101 and the OLED display 103. The voltage converter 104 electrically connects with the OPV cell 101 and the rechargeable battery 105. The OLED display 103 electrically connects with the rechargeable battery 105. The control unit is used for controlling the switch of the OLED display 103 and the OPV cell 101 whether to output electrical energy to the voltage converter 104. The voltage converter 104 is used for converting the electrical energy generated by the OPV cell 101 into a predetermined voltage. The predetermined voltage is suitable for charging the rechargeable battery 105 or conducting the converted electrical energy to the rechargeable battery 105 after supplying electrical energy to the OLED display 103. The rechargeable battery 105 is used for storing the electrical energy generated by the OPV cell 101 and converted by the voltage converter 104 and for supplying the electrical energy to the OLED display 103.

The OLED display 103 used for displaying images comprises an anode layer (not shown in FIG. 1), an OLED layer (not shown in FIG. 1) and a cathode layer (not shown in FIG. 1). The anode layer, the OLED layer and the cathode layer stack to assemble in an order from the bottom to the top. The assembly of the anode layer, the OLED layer and the cathode has at least one pixel comprising three sub-pixels, i.e., red, green and blue sub-pixels.

The OLED display 103 is also used for absorbing solar energy and then converting the solar energy into electrical energy. More specifically, the OLED display 103 arranges the OPV cell 101 used for absorbing and converting solar energy into electrical energy. The OPV cell 101 is disposed on the surface where the OLED layer is. That is to say the OPV cell 101 is positioned between the anode layer and the cathode layer. A first wire is arranged on the anode layer, and a second wire is arranged on the cathode layer. The OPV cell 101 electrically connects with the first wire in the anode layer and the second wire in the cathode layer. The electrical energy generated from the OPV cell 101 outputs to the voltage converter 104 via the second wire in the cathode layer and the first wire in the anode layer.

The OPV cell 101 has at least one secondary battery. The at least one secondary battery arranges together with the red, green and the blue sub-pixels of the OLED display 103. The red, green and the blue sub-pixels are all electrically connected with scan lines 204, a data line 201 and first power lines 202 as shown in FIG. 2 to FIG. 7. The at least one secondary battery is disposed on the surface where the OLED layer is. That is to say the at least one secondary battery is positioned between the anode layer and the cathode layer and electrically connects with the first wire in the anode layer and the second wire in the cathode layer.

Figure 2:
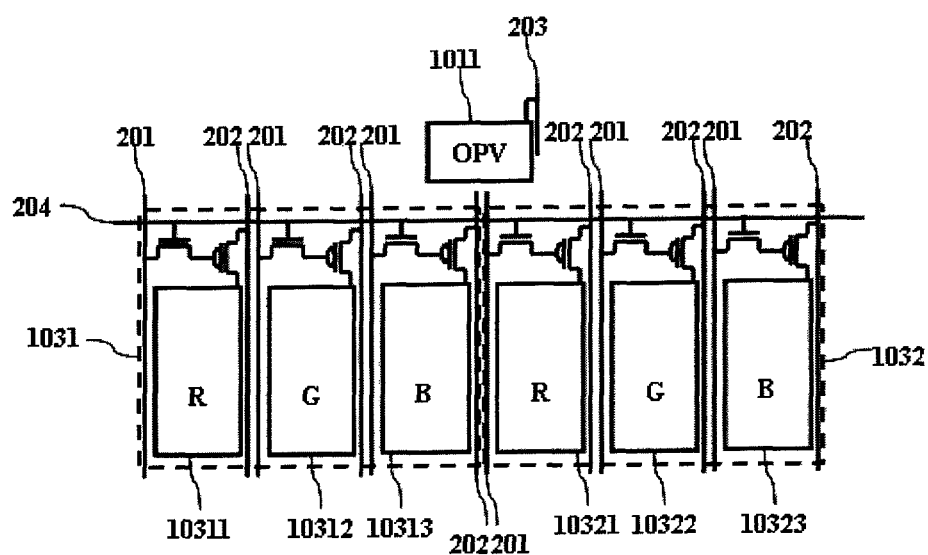
FIG. 2 shows a schematic diagram of a pixel structure of the display device according to a first preferred embodiment of the present invention.

Referring to FIG. 2, FIG. 2 shows a diagram of a pixel structure of the display device according to the first embodiment in the present invention. The shape and size of the first secondary battery 1011 are the same with those of each of a first red sub-pixel 10311, a green sub-pixel 10312 and a first blue sub-pixel 10313 in a first pixel 1031. The first red sub-pixel 10311, the first green sub-pixel 10312 and the first blue sub-pixel 10313 in the first pixel 1031 arranges in the form of a linear matrix. The first secondary battery 1011 locates next to the first pixel 1031. More specifically, the first secondary battery 1011 arranges with the first red sub-pixel 10311, the first green sub-pixel 10312 and the first blue sub-pixel 10313 in the form of a linear matrix. The first secondary battery 1011 electrically connects with the second power line 203, and the second power line 203 is used for outputting the electrical energy generated from the first secondary battery 1011 to the voltage converter 104.

Figure 3:
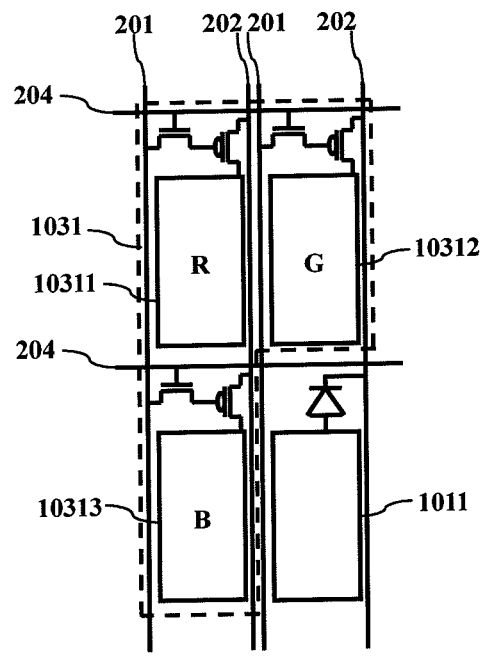
FIG. 3 shows a schematic diagram of a pixel structure of the display device according to a second preferred embodiment of the present invention.

Referring to FIG. 3, FIG. 3 is a diagram of a pixel structure of the display device according to the second embodiment in the present invention. The shape and size of the first secondary battery 1011 are the same with those of each of the first red sub-pixel 10311, the first green sub-pixel 10312 and the first blue sub-pixel 10313 in the first pixel 1031. The first red sub-pixel 10311, the first green sub-pixel 10312 and the first blue sub-pixel 10313 in the first pixel 1031 arranges in the form of matrix. The first secondary battery 1011 locates next to the first pixel 1031. More specifically, the first secondary battery 1011 arranges in the form of matrix with the first red sub-pixel 10311, the first green sub-pixel 10312 and the first blue sub-pixel 10313. The first secondary battery 1011 electrically connects with the first power line 202 via a diode, and the first power line 202 is used for outputting the electrical energy generated from the first secondary battery 1011 to sub-pixels in the first pixel 1031. The conducting direction of the diode goes from the first secondary battery to the first power line 202.

Figure 4:
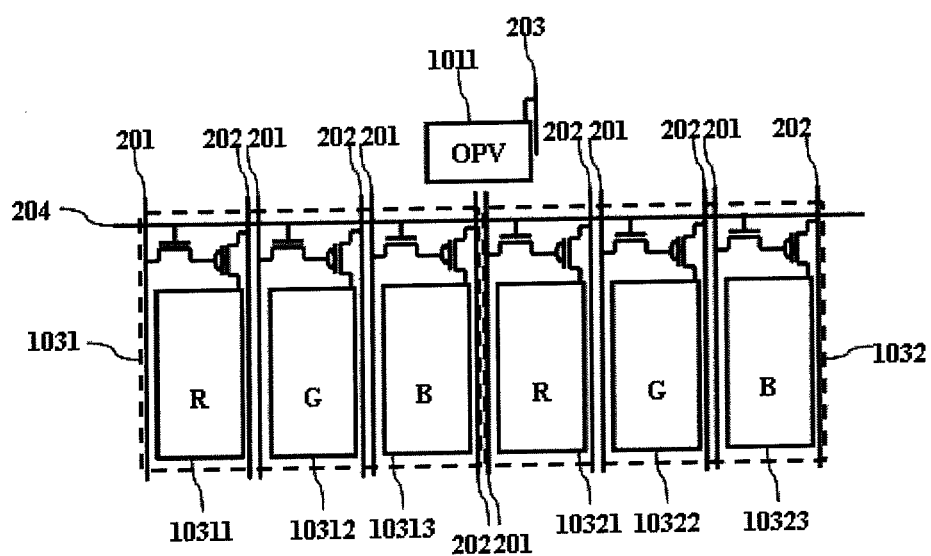
FIG. 4 shows a schematic diagram of a pixel structure of the display device according to a third preferred embodiment of the present invention.

Referring to FIG. 4, FIG. 4 is a diagram of a pixel structure of the display device according to the third embodiment in the present invention. The first pixel 1031 arranges with a second pixel 1032 in column. The first red sub-pixel 10311, the first green sub-pixel 10312 and the first blue sub-pixel 10313 in the first pixel 1031 arrange in the form of linear matrix with a first red sub-pixel 10321, a green sub-pixel 10322 and a first blue sub-pixel 10323 in the second pixel 1032. The first secondary battery 1011 arranges on the first pixel 1031 and the second pixel 1032. More specifically, the first secondary battery 1011 arranges on the position between the two adjacent sub-pixels of the first pixel 1031 and the second pixel 1032 (The first blue sub-pixel 10313 and the second red sub-pixel 10321). Besides that, the first secondary battery 1011 crosses the region where the two sub-pixels (the first blue sub-pixel 10313 and the second red sub-pixel 10321) locate. The first secondary battery 1011 electrically connects with the second power line 203, and the second power line 203 is used for outputting the electrical energy generated from the first secondary battery 1011 to the voltage converter 104.

Figure 5:
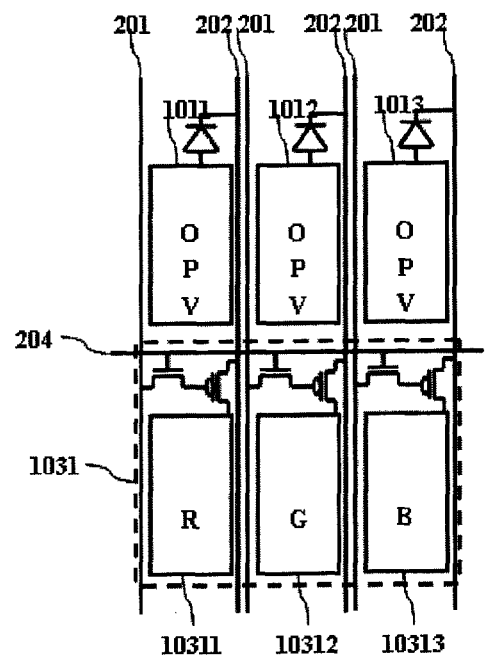
FIG. 5 shows a schematic diagram of a pixel structure of the display device according to a fourth preferred embodiment of the present invention.

Referring to FIG. 5, FIG. 5 is a diagram of a pixel structure of the display device according to the fourth embodiment in the present invention. The shape and size of the first secondary battery 1011, a second secondary battery 1012 and a third secondary battery 1013 are the same with those of the sub-pixels in the first pixel 1031. The first secondary battery 1011, the second secondary battery 1012 and the third secondary battery 1013 are respectively disposed on the first red sub-pixel 10311, the first green sub-pixel 10312 and the first blue sub-pixel 10313 in the first pixel. Each of the first secondary battery 1011, the second secondary battery 1012 and the third secondary battery 1013 electrically connects with the first power line 202 via a diode. The first power line 202 is used for outputting the electrical energy generated from the secondary batteries to the sub-pixels in the first pixels 1031, and the conducting direction of the diode goes from the secondary batteries to the first power line 202.

Figure 6:
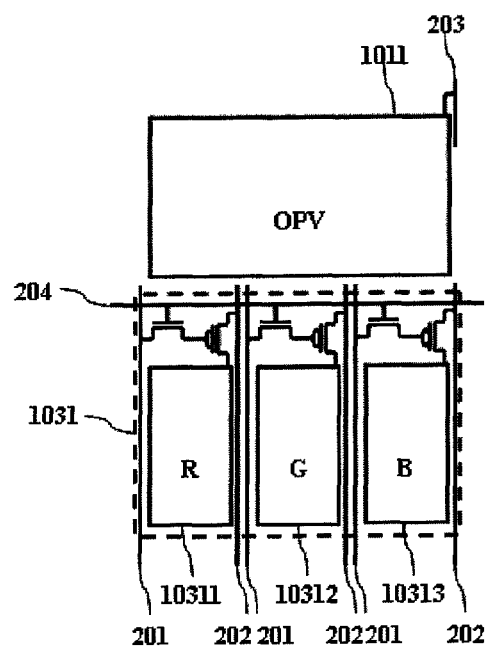
FIG. 6 shows a schematic diagram of a pixel structure of the display device according to a fifth preferred embodiment of the present invention.

Referring to FIG. 6, FIG. 6 is a diagram of a pixel structure of the display device according to the fifth embodiment in the present invention. The first secondary battery 1011 crosses the region where the first red sub-pixel 10311, the first green sub-pixel 10312 and the first blue sub-pixel 10313 in the first pixel locates and is disposed on the first pixel 1031. More specifically, The first secondary battery 1011 is disposed on the first red sub-pixel 10311, the first green sub-pixel 10312 and the first blue sub-pixel 10313. The first secondary battery 1011 electrically connects with the second power line 203, and the second power line 203 is used for outputting the electrical energy generated from the first secondary battery 1011 to the voltage converter 104.

Figure 7:
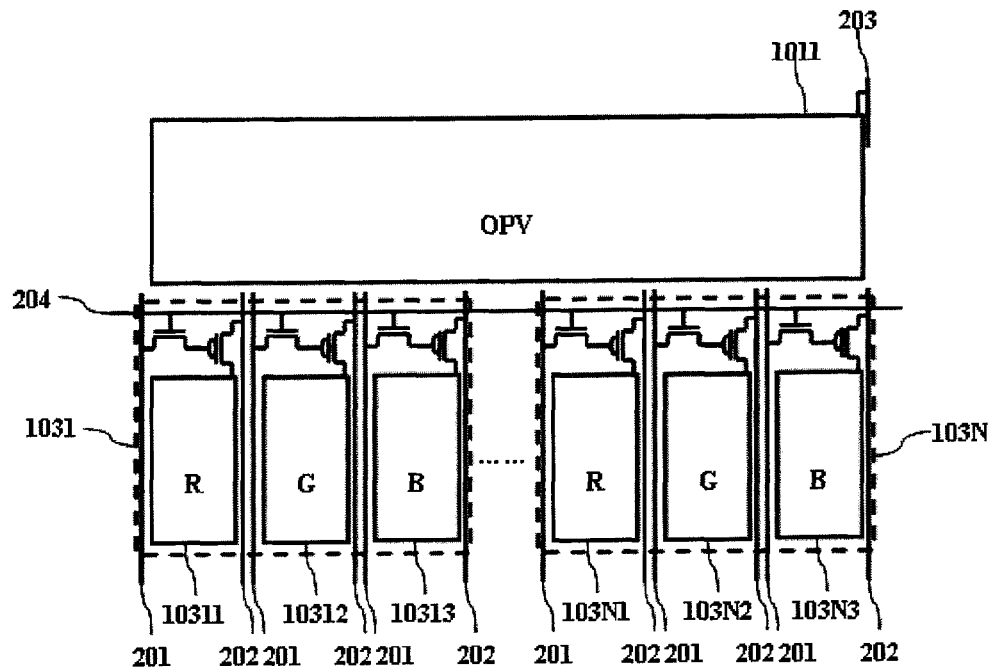
FIG. 7 shows a schematic diagram of a pixel structure of the display device according to a sixth preferred embodiment of the present invention.

Referring to FIG. 7, FIG. 7 is a diagram of a pixel structure of the display device according to the sixth embodiment in the present invention. The first secondary battery 1011 crosses the region where the sub-pixels in the first pixel 1031 and sub-pixels in a N pixel 103N locate. The sub-pixels in the first pixel 1031, the sub-pixels in the second pixel . . . , the sub-pixels in the N pixel 103N arrange in the form of linear matrix. The first secondary battery 1011 is disposed on the region between the first pixel 1031 and the N pixel 103N. More specifically, the first secondary battery 1011 arranges on the region between the first red sub-pixel 10311 in the first pixel 1031 and the Nth blue sub-pixel 103N3 in the N pixel 103N. The first secondary battery 1011 electrically connects with the second power line 203, and the second power line 203 is used for outputting the electrical energy generated from the first secondary battery 1011 to the voltage converter 104.

Figure 8:
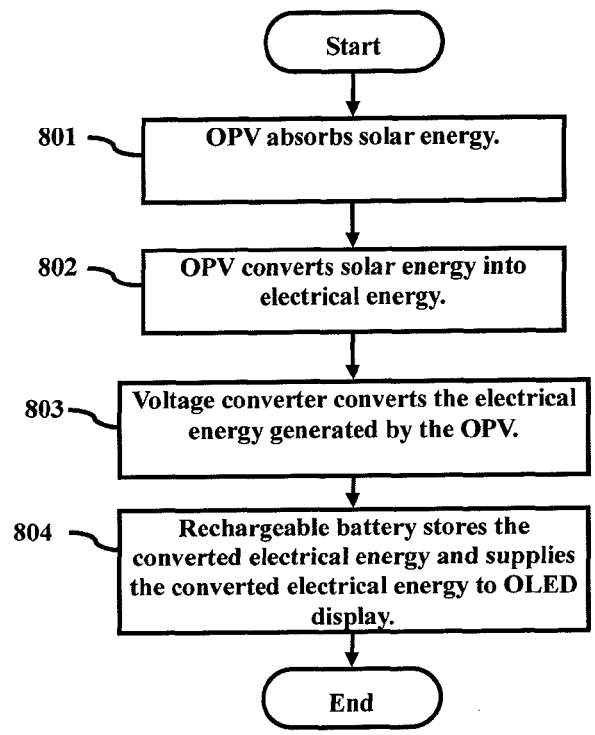
FIG. 8 shows a flowchart of a method of using a display device to convert solar energy to electrical energy according to the present invention.

FIG. 8 shows a flowchart of a method of using a display device to convert solar energy to electrical energy according to the present invention. In Step 801, the OPV cell 101 in the OLED display 103 absorbs solar energy. More specifically, The OLED display 103 arranges at least one pixel including red sub-pixel, green sub-pixel and blue sub-pixel. The OPV cell 101 comprises at least one secondary battery which arranges together with the red sub-pixel, the first green sub-pixel and the blue sub-pixel in the at least one pixel. The secondary battery in the OLED display 103 absorbs solar energy, In Step 802, The OPV cell 101 converts the solar energy into the electrical energy and then outputting the electrical energy to the voltage converter 104. More specifically, at least one secondary battery in the OPV cell 101 converts the absorbed solar energy into the electrical energy. In Step 803, The voltage converter 104 converts voltage of the electrical energy generated from the OPV cell 101 to fit for charging the rechargeable battery 105 or supplying electrical energy to the OLED display 103. In Step 804, the rechargeable battery 105 saves the converted electrical energy and supply electrical energy to the OLED display 103 as the OLED display 103 is switched on by the control unit 102.

In the present invention, the OLED display 103 arranges the OPV cell 101. More specifically, there are a plurality of secondary batteries, arranging with the pixels in the OLED display 103 together, in the present invention. Therefore, the display device in the present invention is capable of absorbing and then converting solar energy into electrical energy. In addition, the present invention also proposes the voltage converter 104 and the rechargeable battery 105 to convert the electrical energy generated from the OPV cell 101, which is for charging the rechargeable battery 105 and supplying electrical energy to the OLED display 103. In hence, it leads to the OLED display 103 to achieve solar electrical energy generation.

While the present invention has been described in connection with what is considered the most practical and preferred embodiments, it is understood that this invention is not limited to the disclosed embodiments but is intended to cover various arrangements made without departing from the scope of the broadest interpretation of the appended claims.

What is claimed is:
1. A display device comprising:
an organic light emitting diode (OLED) display for displaying images, the OLED display comprising at least one pixel, each pixel comprising a plurality of sub-pixels, the OLED display arranging a plurality of organic photovoltaic (OPV) cells for absorbing solar energy and then converting the solar energy into electrical energy, each OPV cell being connected to one of the plurality of sub-pixels via a diode and a first power line;
a voltage converter electrically connected with the OPV cell, for converting voltage of the electrical energy generated from the OPV cell;
a rechargeable battery electrically connected with the OLED display and the voltage converter, for saving elec- trical energy generated from the OPV cell and supplying electrical energy to the OLED display; and a control unit electrically connected with the OLED display and the voltage converter for controlling a switch of the OLED display and controlling the OPV cell to output electrical energy to the voltage converter, wherein the first power line is used for outputting the electrical energy generated from the OPV cell to the sub-pixel, and a conducting direction of the diode goes from the OPV cell to the first power line.

2. The display device of claim 1, wherein the OPV cell comprises at least one secondary battery disposed on the OLED display, and the secondary battery is used for absorbing solar energy and converting the solar energy into electrical energy.

3. The display device of claim 2, wherein the OLED display comprises an OLED layer, and the secondary battery is disposed on the surface where the OLED layer locates.

4. The display device of claim 3, wherein the OLED display further comprises an anode layer and a cathode layer, and the secondary battery electrically connects with the anode layer and the cathode layer.

5. The display device of claim 4, wherein the secondary battery is also used for outputting the electrical energy to the voltage converter via the anode layer and the cathode layer.

6. A display device comprising:

an organic light emitting diode (OLED) display for displaying images, the OLED display comprising at least one pixel, each pixel comprising a plurality of sub-pixels, the OLED display arranging a plurality of organic photovoltaic (OPV) cells for absorbing solar energy and then converting the solar energy into electrical energy, each OPV cell being connected to one of the plurality of sub-pixels via a diode and a first power line; and a voltage converter electrically connected with the OPV cell, for converting voltage of the electrical energy generated from the OPV cell, wherein the first power line is used for outputting the electrical energy generated from the OPV cell to the sub-pixel, and a conducting direction of the diode goes from the OPV cell to the first power line.

7. The display device of claim 6, wherein the OPV cell comprises at least one secondary battery disposed on the OLED display, and the secondary battery is used for absorbing solar energy and converting the solar energy into electrical energy.

8. The display device of claim 7, wherein the OLED display comprises an OLED layer, and the secondary battery is disposed on the surface where the OLED layer locates.

9. The display device of claim 8, wherein the OLED display further comprises an anode layer and a cathode layer, the secondary battery electrically connects with the anode layer and the cathode layer, and the secondary battery is used for outputting the electrical energy to the voltage converter via the anode layer and the cathode layer.

10. The display device of claim 6 further comprising a rechargeable battery electrically connected with the OLED display and the voltage converter, for saving electrical energy generated from the OPV cell and supplying electrical energy to the OLED display.

11. The display device of claim 6 further comprising a control unit electrically connected with the OLED display and the voltage converter, for controlling a switch of the OLED display and controlling the OPV cell to output electrical energy to the voltage converter.

* * * * *